United States Patent
Hermann et al.

(10) Patent No.: US 10,104,786 B2
(45) Date of Patent: Oct. 16, 2018

(54) HOUSING WITH A ROTATIONAL FRICTION WELDING SEAM

(71) Applicant: R. Stahl Schaltgeräte GmbH, Waldenburg (DE)

(72) Inventors: Wolf Hermann, Öhringen (DE); Normen Schwarz, Weimar (DE)

(73) Assignee: R. Stahl Schaltgerate GmbH, Waldenburg (DE)

( * ) Notice: Subject to any disclaimer, the term of this patent is extended or adjusted under 35 U.S.C. 154(b) by 317 days.

(21) Appl. No.: 14/769,523

(22) PCT Filed: Feb. 5, 2014

(86) PCT No.: PCT/EP2014/052262
§ 371 (c)(1),
(2) Date: Aug. 21, 2015

(87) PCT Pub. No.: WO2014/127996
PCT Pub. Date: Aug. 28, 2014

(65) Prior Publication Data
US 2016/0001497 A1    Jan. 7, 2016

(30) Foreign Application Priority Data
Feb. 21, 2013  (DE) .................. 10 2013 101 727

(51) Int. Cl.
*H05K 5/00* (2006.01)
*B32B 1/02* (2006.01)
(Continued)

(52) U.S. Cl.
CPC ....... *H05K 5/0004* (2013.01); *B29C 65/0672* (2013.01); *B29C 66/1122* (2013.01);
(Continued)

(58) Field of Classification Search
CPC ...... H05K 5/00; H05K 5/0004; H05K 5/0047; H05K 5/0052; H05K 5/0091;
(Continued)

(56) References Cited

U.S. PATENT DOCUMENTS 8,840,437 B2 * 9/2014 Hentschel ............. H01R 4/029
439/874

FOREIGN PATENT DOCUMENTS

CN     102202760 A    9/2011
KR   2011 0128765 D1    11/2011

OTHER PUBLICATIONS

Office Action dated Sep. 20, 2016, in Chinese Patent Application No. 201480009666.1, filed Feb. 5, 2014 (w/ English-language translation).

* cited by examiner

*Primary Examiner* — Walter Aughenbaugh
(74) *Attorney, Agent, or Firm* — Leydig, Voit & Mayer, Ltd.

(57) ABSTRACT

A housing (10) which has a first part (14) with a first wall (22) having an outer wall surface (28) and a second part (18) with a second wall (24) having an inner wall surface (30). The wall surfaces can have for example a cylindrical casing shape at least in some sections. Portions of the first wall (22) and the second wall (24) overlap in an overlap region (26). The first wall (22) and the second wall (24) are connected along the circumference of the wall surfaces (28, 30) by means of a rotational friction welding seam (32) arranged in the overlap region (26). The rotational friction welding seam (32) has a compact zone (48) with a first elastic modulus and a mixing zone (44) with a different second elastic modulus.

18 Claims, 3 Drawing Sheets

(51) Int. Cl.
    *B29C 65/06*   (2006.01)
    *B29C 65/00*   (2006.01)
    B29L 31/00     (2006.01)
    B29L 31/34     (2006.01)
    B29K 69/00     (2006.01)

(52) U.S. Cl.
    CPC ........ *B29C 66/542* (2013.01); *B29C 66/7392* (2013.01); *B29C 66/73771* (2013.01); *B29C 66/73772* (2013.01); *B29C 66/73921* (2013.01); *B29C 66/742* (2013.01); *B29C 66/7465* (2013.01); *B32B 1/02* (2013.01); *H05K 5/00* (2013.01); *B29C 66/1222* (2013.01); *B29C 66/1224* (2013.01); *B29C 66/71* (2013.01); *B29C 66/712* (2013.01); *B29K 2069/00* (2013.01); *B29L 2031/3481* (2013.01); *B29L 2031/712* (2013.01); *B29L 2031/749* (2013.01)

(58) Field of Classification Search
    CPC .............. H05K 5/0217; B29C 65/0672; B29C 66/742; B29C 66/7422; B29C 66/7465; B29C 66/74281; B29C 66/74283; B32B 1/02
    See application file for complete search history.

HOUSING WITH A ROTATIONAL FRICTION WELDING SEAM

CROSS-REFERENCE TO RELATED APPLICATIONS

This patent application is the national phase of PCT/EP2014/052262, filed Feb. 5, 2014, which claims the benefit of German Patent Application No. 10 2013 101 727.4, filed Feb. 21, 2013.

FIELD OF THE INVENTION

The present invention relates to housings for electrical operating means and a method for manufacturing such housings.

BACKGROUND OF THE INVENTION

In order to produce tubular housings, in particular pressure-resistant tubular housings, drawbar structures for end-side closure or closures with casting compounds are frequently used. The assembly requires special mechanical preparation. Publication EP 1 255 072 A2, for example, shows an explosion-proof lamp with a translucent housing tube whose housing parts are connected to each other with the use of two tie anchors. However, the manufacture and assembly of such structures is expensive.

Furthermore, methods for rotational friction welding have been known for connecting thermoplastic plastic materials. In that case, the required thermal energy is applied for fusing the materials by relative rotation of the parts to be connected. Since the friction welding process takes a maximum of a few seconds, it is possible to produce objects at a high rate in this manner.

Publication DE 38 53 951 T2 describes a plastic container that is pressure-proof and comprises a tubular body part and end closure parts. In this case, an annular recess is provided on the edge of one end closure part, and the end of the tubular body part is placed in the recess. Subsequently, the end closure part as well as the tubular body part are connected to each other by fusing the end of the tubular body part to the former by means of rotational friction welding. This is aided by an undercut which is provided on the recess and into which the fusing material of the end will flow. As a result, the housing is closed in a fluid-tight manner and capable of for receiving fluids that are under static pressure, wherein, for example, pressures of approximately 10 bar may act on the container body.

Publication DE 199 11 284 A1 describes a method for producing a sleeve joint of two tubes. A sleeve that tapers slightly conically toward the center is subjected to a rotational movement. The non-rotationally supported tubes are moved along the axis of rotation of the sleeve into said sleeve so that a fusion of the sleeve and pipe material and the formation of a rotational friction welding seam are attained. The sleeve and the tubes display comparable radial elasticity. This is different in the case of the connection of a relatively rigid cap or a lid for a housing having a cylindrical base body that is relatively elastic with respect thereto. Under conditions of alternating thermal stress there is the risk of a crack formation, in particular at the axial transition of the cap to the tube. In addition, in case of an explosion inside or outside the housing, i.e., under shock-like pressure stress, it is possible for the base body to shear off in particularly such a transition from a cap or a sleeve to the tube.

OBJECTS AND SUMMARY OF THE INVENTION

It is the object of the invention to provide an improved housing, in particular for electrical operating means, and a method for the manufacture such a housing.

While the housing according to the invention is disposed for the accommodation of electrical operating means; it may also act as a housing for other devices. The housing comprises a first part with a first wall that has, e.g., a cylindrical outside wall surface. A second part of the housing with a second wall has an inner wall surface that may be cylindrical, for example. The first wall and the second wall overlap in an overlap region and are connected within the overlap region by means of a rotational friction welding seam on the wall surfaces along their circumference. The rotational friction welding seam forms a circular closed ring. The rotational friction welding seam is defined concentrically about the center axis of the housing, said axis forming—at the same time—the axis of rotation of the housing.

The rotational friction welding seam comprises at least one compact zone and one mixing zone. The compact zone preferably exhibits a homogenous material distribution. The mixing zone preferably exhibits an inhomogeneous material distribution. For example, the compact zone may be produced by fully fused material. The mixing zone may contain partially fused material. The rotational friction welding seam may comprise one single or several mixing zones or one single or several compact zones. Due to the compact zone and the mixing zones, it is possible to create zones exhibiting different elasticities. In so doing, in particular the mixing zone can act as the radial transition zone between a first part and a second part exhibiting different elasticities—in particular in a direction transverse to the axis of rotation. A mixing zone may contain, for example, pores, other interstices, abrasion solids and/or solids fragments and/or slubs and/or lamellae of re-solidified melt. The mixing zone displays mechanical properties that are different from the mechanical properties of the compact zone. In particular, the mixing zone may exhibit a higher resilience than the compact zone, i.e., may offer less resistance during deformation.

Preferably, the mixing zone is arranged on one axial end of the rotational friction welding seam. Respectively one mixing zone may be formed on each of the two axial ends, said mixing zone being axially separated by a compact zone. Preferably, a mixing zone is arranged in one axial edge region of the overlap region, i.e., along the axis of rotation, where the transition from the overlap region to the first part or to the second part is located. For example, the compact zone may be arranged axially in the center of the rotational friction welding seam. It is also possible for the compact zone to extend from a region in the axial center of the rotational friction welding seam to one axial end of the rotational friction welding seam.

A uniform or abrupt transition may be created between the compact zone and the mixing zone parallel to the axis of rotation. The transition between the compact zone and the mixing zone may follow a straight line along the circumference or be curved or have a wave-form, i.e., the compact zone may enter into the mixing zone, for example, parallel to the axis of rotation. Parallel to the axis of rotation, the compact zone may have a greater extension (length) than the mixing zone.

Compact zones and mixing zones may alternate along the circumference of the rotational friction welding seam, and each may extend, for example, parallel to the axis of rotation. One or more mixing zones may be formed as spots or islands in a compact zone, in which case the compact zone may be cohesive, for example. It is also possible for one or more compact zones to be configured as spots or islands in a mixing zone, in which case the mixing zone may be cohesive, for example. Spots of compact zones and mixing zones, respectively, may be arranged regularly or form an irregular pattern. Accordingly, compact zone spots and mixing zone spots may be arranged alternately in circumferential direction and/or in the direction of the axis of rotation.

The fused or re-solidified material in the compact zone preferably exhibits greater density than the material of the mixing zone. For example, it may contain fewer pores, abrasion solids or the like. The compact zone is disposed to achieve the integrity of the housing, in particular in the event of forces acting parallel to the axis of rotation. Due to the compact zone, it is possible to achieve in particular the leak tightness of the housing. The mixing zone is disposed, in particular, to mechanically secure the transition from the first to the second part and may act as a buffer zone. Due to the inhomogeneity of the mixing zone, the mixing zone may be turbid or even opaque, even if a glass-clear plastic material is used.

Preferably, the rotational friction welding seam extends axially along the entire overlap region. The rotational friction welding seam extends parallel to the axis of rotation and is preferably restricted to the overlap region. However, the rotational friction welding seam may also extend—at least on one side—beyond the overlap region. For example, the solidified melt may also be provided outside the overlap region and contribute there, for example, to the mechanical stability and/or the leak tightness of the frictional welding seam. Preferably, the first part and the second part are connected to each other without interruption on the wall surfaces along the entire periphery, i.e., along the circumference.

The axial lengths of the compact zone and the mixing zone may be different and, for example, are a function of the material and form parameters of the first and the second part and, in addition, of the parameters of the manufacturing process. The length of the mixing zone may be a few millimeters, for example. However, the length of the mixing zone may also be only a few hundredths of a millimeter. The compact zone is preferably longer than the mixing zone. The length of the compact zone is at least 10 mm, for example. The thickness of the compact zone and the thickness of the mixing zone of a rotational friction welding seam may differ in radial direction transverse to the axis of rotation. The mixing zone may be radially thicker than the compact zone. This promotes its springy and/or plastic deformability or resilience.

In addition to the first and second parts, the housing may comprise additional parts. Connections between the parts of the housing may be rotational friction welding seams, or the parts may be connected in another manner. The housing or a part of the housing may be transparent or translucent. Preferably, the housing is waterproof. It is advantageous if the housing is configured so as to satisfy the specifications of protection level explosion-proof encapsulation (Ex-d). Particularly preferably, the housing (in particular the connections of housing parts) satisfies the specifications of DIN EN 60079-1. The housing may also be configured to satisfy protection level Ex-e. For example, the housing may act as a lamp housing or as a housing for signal transmitters or be used for the shielded installation of cables, for example, as cable conduits, or contain optical sensors.

Preferably, the housing has a cylindrical, tubular body. Furthermore, the housing may have a cap that is designed to close the tubular body on one side. To do so, the cap is placed over the tubular body and forms an overlap region together with said tubular body. In this manner, the overlap region between the first part (e.g., the tubular body) and the second part (e.g., the cap) is formed. The overlap region of the tubular body with the cap may comprise a rotational friction welding seam having a compact zone and a mixing zone. A housing may also have a tubular body in that at least a stopper is provided on one side of the body, said stopper closing said body. For example, in the case of such a housing, the first part is the stopper and the second part is the tubular body. The stopper and the body, in turn, may be connected by the previously described rotational friction welding seam.

The housing may comprise at least one tubular part that is connected to a sleeve or a nipple by means of the inventive rotational friction welding seam having a compact zone and a mixing zone. It is also possible to directly connect two tubular parts with the aid of a sleeve, a nipple or by direct connection by means of rotational friction welding seams. A sleeve is viewed as a cuff-like connecting piece that is arranged around the end sections of both tubular parts in order to connect said parts. A nipple is a connecting piece that is arranged inside the tubular parts in the end sections of both tubular parts.

Each of the first and second parts has a wall that has a wall surface extending inside or outside around the wall. Such a wall surface may be smooth and round or have corners so as to form a multi-edge surface, or have facets. In cross-section, i.e., in a direction transverse to the axis of rotation, the wall surface may be circular or elliptical or polygonal. A part of the wall surface may have a tubular form, for example, in which case it may be a cylindrically round or multi-edge tubular form or a prismatic tubular form. The wall surface may extend parallel to the axis of rotation and have a constant diameter or circumference along the axis of rotation. The wall surfaces have the "shape of a casing". This includes wall surfaces having a straight cylindrical casing shape, for example also conical wall surfaces or curved wall surfaces that enclose a body. A wall surface, for example, may be round or wave-shaped so as to at least partially deviate from a straight conical or cylindrical wall form. For example, the casing-shaped wall surface may also conically widen or taper—at least in some sections—in the direction of the axis of rotation. Furthermore, a casing-shaped wall surface may include a step, i.e., an abruptly changing diameter. One or more slits or gaps may exist in a casing-shaped wall surface, for example in axial direction. In this manner, the wall surface may be interrupted along its circumference. The shapes of the wall surfaces of the first and of the second wall are configured so as to be complementary relative to each other. Preferably, a form deviating from the conical form or from a strict, cylindrical form may be characterized at least in some sections by an angle that defines the inclined position of the wall surface relative to and in the direction toward the axis of rotation. Preferably, the angle characterizing the inclined position is between 1 degree to 3 degrees.

The wall surfaces of the first and/or the second parts may have recesses such as, for example, pockets, scores or grooves. For example, such recesses may act to receive the melt or conduct or guide the melt flow, or to control the formation of the melt during the production of the friction welding seam. Preferably, recesses are arranged in and restricted to the overlap region. Sections of a recess may extend over the overlap region or project over said region on at least one side of the overlap region. Recesses may extend along and/or transversely to the axis of rotation. Recesses, in particular grooves or furrows, may extend along the circumferential direction of a casing-shaped wall surface. In this manner, a recess may follow a helical line on the wall surface. A recess may extend along the axis of rotation. Preferably, a part has several grooves extending in circumferential direction. One wall surface of a part, for example the first part, may have recesses, whereas the wall surface of the other part does not have any recesses. The first and the second parts may have channels for controlling the formation of the melt or the melt flow, for example.

In one embodiment, neither the first nor the second wall surfaces have recesses in the overlap region, in which case the surface roughness is excluded. In this manner, the rotational friction welding seam can be formed without undercuts.

The diameter of a first or of a second part may be 10 mm to 70 mm, relative to the wall surface. The thickness of the wall of one part preferably depends on the diameter of the part and may be 1 mm to 5 mm, for example.

A wall and its wall surface may consist of the same material or of different materials. The walls of the first and of the second parts may consist of the same or different materials or partially consist of a different material. Preferably, the first wall and the second wall consist of or contain plastic material. The preferred wall material is an amorphous thermoplastic plastic material. For example, one wall may consist of polycarbonate. It is also possible, for example, that—of the first and the second parts—only the wall of one part consists of or contains plastic material, whereas the other wall consists of glass, metal or a composite material, for example.

The homogeneous compact zone and/or the inhomogeneous mixing zone of the frictional welding seam may each contain a single type of plastic material such as, for example, polycarbonate, or contain or consist of several types of plastic material. In particular, the compact zone, as well as the mixing zone, may contain or be mixed with materials of the first wall and of the second wall.

Preferably, each of the first and the second parts has an end surface. An end surface may be oriented transversely relative to a wall surface. For example, in one embodiment with a cap and a cylindrical tube on one side, an end surface is created by an axial cover surface at one end of the tube; on the other side, the cap has an end surface that axially closes the tube. In addition to the connection by the rotational friction welding seam, the first and the second parts may be connected by an axial rotational friction welding seam on the end surfaces of the first and the second parts. For example, a ring may be arranged in a sleeve, said ring having two end surfaces, wherein a tube arranged in the sleeve may be connected to the sleeve by means of a rotational friction welding seem on the circumference and an axial rotational friction welding seam on one end surface.

In one embodiment the first and the second parts may not have any friction welding seam on an end surface separate from a wall surface and thus be connected by a friction welding seam only on the circumference on the casing-shaped inner and outer wall surfaces, respectively.

The method in accordance with the invention relates to the formation of a friction welding seam having a compact zone and a mixing zone. The method is designed for the manufacture of a housing that can be used for electrical operating means and that defines an axis of rotation and comprises a first part with a first wall and a second part with a second wall. The first wall has a casing-shaped outer wall surface and the second wall has a casing-shaped inner wall surface. To produce this, the first part and the second part are rotationally driven relative to each other about the axis of rotation. The first part and the second part can be moved toward each other by a relative feed movement. In the event of a contact of the end surfaces and/or the circumferential surfaces of the first and the second parts, a fusion of the material of at least one part of the contact surface occurs. Finally, due to the re-solidified melt, a friction welding seam is formed on the wall surfaces, said friction welding seam comprising a compact zone having a homogeneous material distribution and a mixing zone having an inhomogeneous material distribution. The formation of the compact zone and of the mixing zone and their properties such as, for example, the length of the zones in the direction of the axis of rotation, may be controlled by material parameters, form parameters and process parameters. In conjunction with this, for example, the diameters of the first part and of the second part play a role as the form parameters, wherein, preferably, an interference fit between the first and the second parts is selected. Preferably, one part has a section that tapers conically in feed direction, followed by a section having a constant circumference along the axis of rotation. In this manner, it is possible to form a stop slope on the part. The other part may comprise a clearance fit relative to the conically tapering section and an interference fit on the section having the constant circumference. The properties of the compact zone and the mixing zone, for example their lengths, their configuration and the like, can also be controlled via the lengths of the conical section, the angle of the conical section and the length of the section having the constant circumference, as well as via the interference of the interference fit.

In order to control the formation of the compact and the mixing zones, additional recesses such as, for example, grooves may be provided in the first and/or in the second parts, said grooves being able to at least partially receive and/or transport the forming melt. The recesses may also be circular or rectangular or square, for example. Furthermore, elevations such as, for example, nubs or elongated elevations may be provided on the first and/or the second parts. Parameters that influence compact and mixing zones are, for example, the dimensions of the recesses or elevations, the orientation relative to the axis of rotation, the progression relative to the direction of rotation, and the arrangement in the region of the rotational friction welding seam. Other control options result from the relative speed of the surfaces of the first and second parts, the feed speed, the feed force and also from the chronological progression of said values via the friction welding process, as well as the entire process time from the fusion of the wall material up to the solidification of the melt. In guiding the process, the fusion is preferably restricted to only the wall surface regions of the first and the second parts in order to attain the stability of the first and second parts. This can be achieved, e.g., by a relatively short process time.

Other objects and advantages of the invention will become apparent upon reading the following detailed description and upon reference to the drawings.

While the invention is susceptible of various modifications and alternative constructions, certain illustrative embodiments thereof have been shown in the drawings and will be described below in detail. It should be understood, however, that there is no intention to limit the invention to the specific forms disclosed, but on the contrary, the intention is to cover all modifications, alternative constructions, and equivalents falling within the spirit and scope of the invention.

DETAILED DESCRIPTION OF THE PREFERRED EMBODIMENTS

Figure 1:
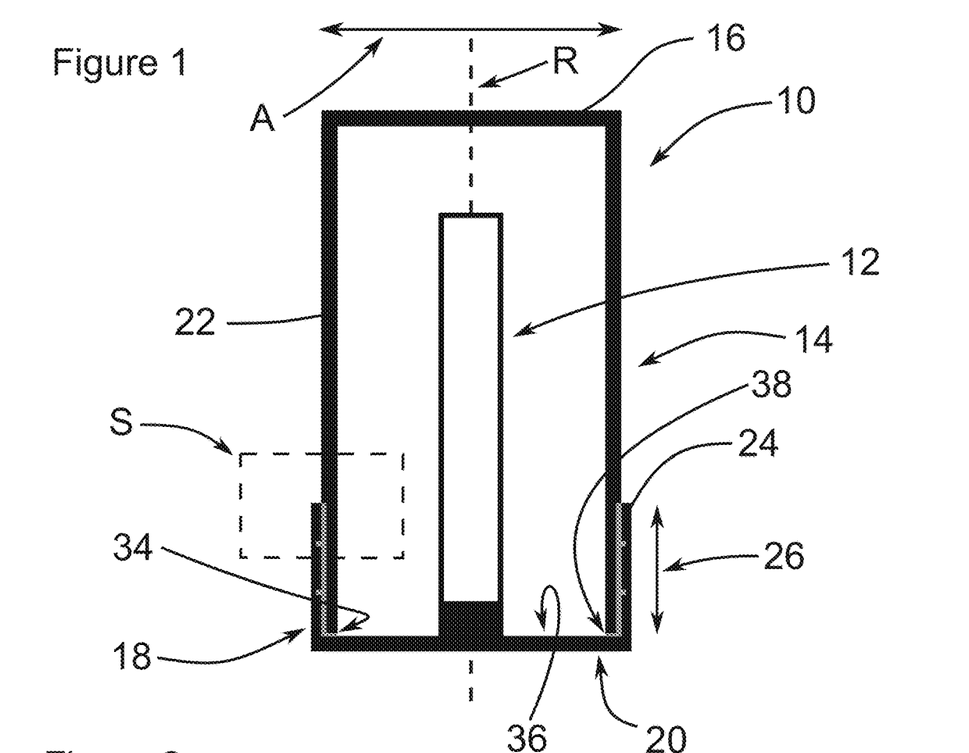
FIG. 1 is a vertical section of an illustrative housing in accordance with the invention containing an electrical operating means.

Referring now more particularly to FIG. 1 of the drawings, there is shown an illustrative housing 10 in accordance with the invention, in this case containing a lamp 12 and being configured in an explosion-proof manner satisfying the safety level of a pressure-proof encapsulation (Ex-d) and, additionally, being waterproof. By its cylindrical shape, the housing 10 defines an axis of rotation R. The housing 10 comprises a first part 14 that is tubular or cylindrical and has a bottom 16. The first part 14 has an outside diameter A of approximately 60 mm. A second part 18 having the form of a cap is welded onto the first part 14. The first part 14 and the second part 18 are in this case each produced by injection molding and consist of an amorphous transparent polycarbonate. However, the first part 14 and the second part 18 may also consist of different materials. For example, one of the parts may consist of glass or steel or of a plastic material other than polycarbonate.

The cap 18 has an end surface 20 that is oriented transversely to the axis to rotation R. One section of the first wall 22 of the first part 14 overlaps with a second wall 24 of the cap 18, said second wall extending around the first part 14. The first wall 22 has an outer wall surface 28 that has the shape of a cylindrical casing. It is connected to an inner wall surface 30 of the second part 18 that has the shape of a cylindrical casing via a rotational friction welding seam 32. The outer wall surface 28 and/or the inner wall surface 30 may also have a casing shape deviating from a cylindrical form. For example, the wall surfaces may taper conically and/or be provided with facets, and be configured as multi-edge surfaces. On the end of the first wall 22 of the first part 14 arranged in the second part 18, the first part 14 has an annular end surface 34. Between the annular end surface 34 extending in circumferential direction and the end surface 36 of the end wall 20 of the second part 18, there is a welding zone 38 with solidified melt. The solidified melt in the welding zone 38 has formed due to friction of the cover surface 34 on the end wall surface 36. The melt may also be fused material of the outer wall surface 28 or the inner wall surface 30, which material has arrived by capillary action or by material advance in the region of the welding zone 38 and forms a heat bond at that location.

Figure 2:
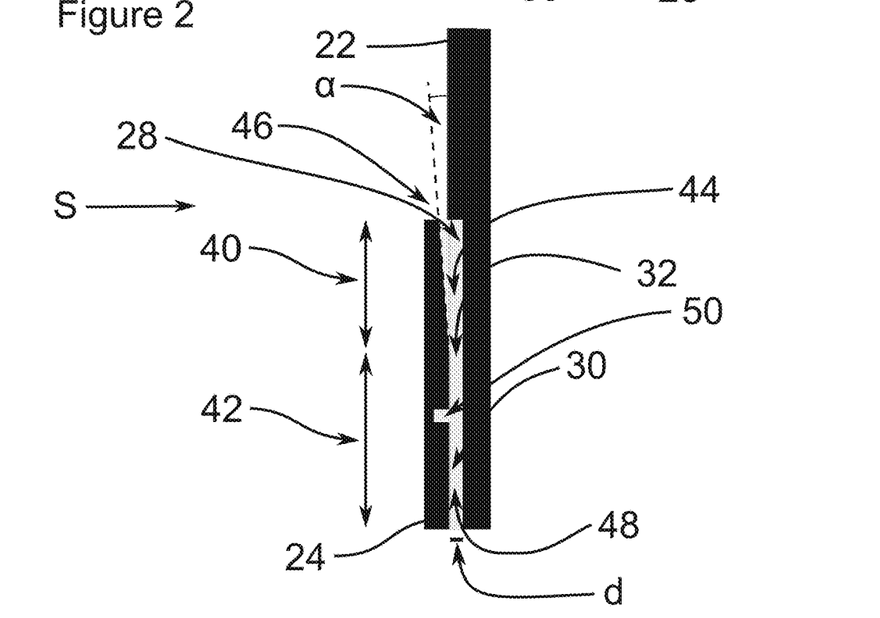
FIG. 2 is an enlarged vertical section of the detail S shown in FIG. 1 of the illustrated housing.

FIG. 2 shows a detail S of the housing. The second wall 24 of the second part 18 has, in a first section 40 remote from the end wall 20, a form that conically tapers in the direction of the end wall 20. In a second section 42 located closer to the end wall 20 along the axis of rotation R, the inner wall surface of the second wall 24 has a constant diameter. In an edge region 46 of the overlap region 26 at the of the overlap region to the first part 14 along the axis of rotation R, the rotational friction welding seam 32 has a mixing zone 44 with an inhomogeneous material distribution. In the exemplary embodiment, the mixing zone 44 is, in particular, a fine-pore foam. This foam provides mechanical securing in this edge region 46. In this manner, it is possible, for example, to create a buffer zone that yields in particular to forces that could be due to an explosion inside the housing 10. Otherwise such forces could lead to a shearing off of the first part 14 over the edge of the second part 18 in the edge region 46.

Furthermore, the rotational friction welding seam 32 has a compact zone 48 that is located in a section of the rotational friction welding seam 32 along the axis of rotation R closer to the end wall 20. The rotational friction welding seam may also have an additional melting zone that is separated in axial direction, by the compact zone 48, from the mixing zone 44. Compared with the mixing zone 44, the compact zone 48 has a more homogeneous material distribution with a greater density. The rotational friction welding seam 32 has a radial thickness d that, due to the conical progression in some sections of the otherwise conical progression of the inner wall surface 30 having the shape of a cylindrical casing, can assume different values along the axis of rotation R. In addition, the depicted housing 10 has grooves 50 that are provided in the second wall 24 and extend around the periphery of said wall. The grooves 50 are disposed to receive the melt for the control of the melt flow and as undercuts for mechanically securing the housing. The first wall 22 and the second wall 24 are connected along their entire circumference by means of the rotational friction welding seam. The recesses or grooves 50 may also be configured as pockets that are regularly or irregularly arranged at some points along the circumference and that, for example, are disposed for receiving excess melt or for mechanical securing.

Figure 3:
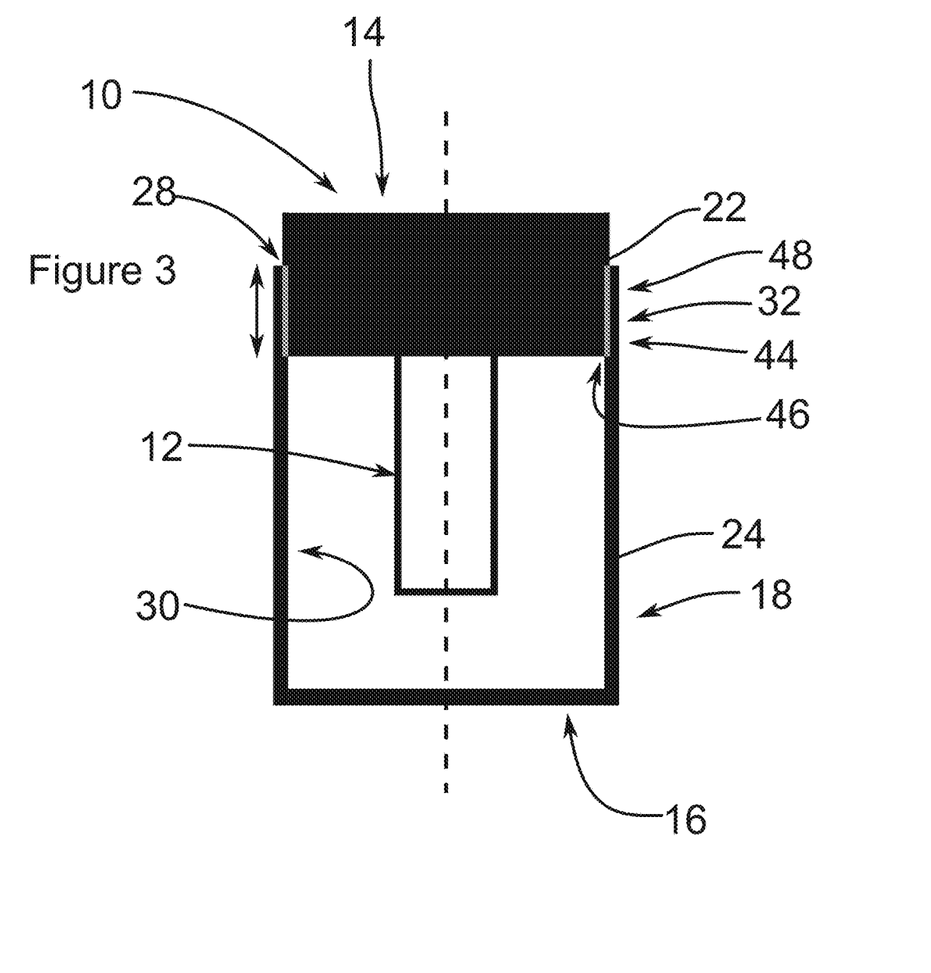
FIG. 3 is a vertical section of an alternative embodiment of housing in accordance with the invention.

FIG. 3 shows another housing 10 according to the invention, said housing containing an electrical operating means 12. The first part 14 is configured as a massive stopper that closes the second part 18. At the same time, the electrical operating means 12 is fastened to the stopper. The first part 14 has a first wall 22 that has an outer wall surface 38 having the shape of a cylindrical casing. The first part 14 and the second part 18 are connected only by a rotational friction welding seam 32 between the outer surfaces 28 having the shape of a cylindrical casing and the inner wall surface 30 of the second part 18 having the shape of a cylindrical casing.

The rotational friction welding seam 32 has a mixing zone 44 that is provided at the transition from the first part 14 to the overlap region along the direction of the axis of rotation in an edge region 46 of the overlap region 26. The elastic modulus of the mixing zone 44 is greater than that of the compact zone 48 that is provided next to the mixing zone 44 at a distance from the edge region 46. At this location, the mixing zone 44 reduces the risk of a tearing off of the second wall 24 during an explosion in the interior of the housing 10. The compact zone 48 of the rotational friction welding seam 32 has a homogeneous material distribution and is disposed to seal the housing 10. There are no recesses provided in the overlap region 26, so that the rotational friction welding seam is formed without undercuts.

Figure 4:
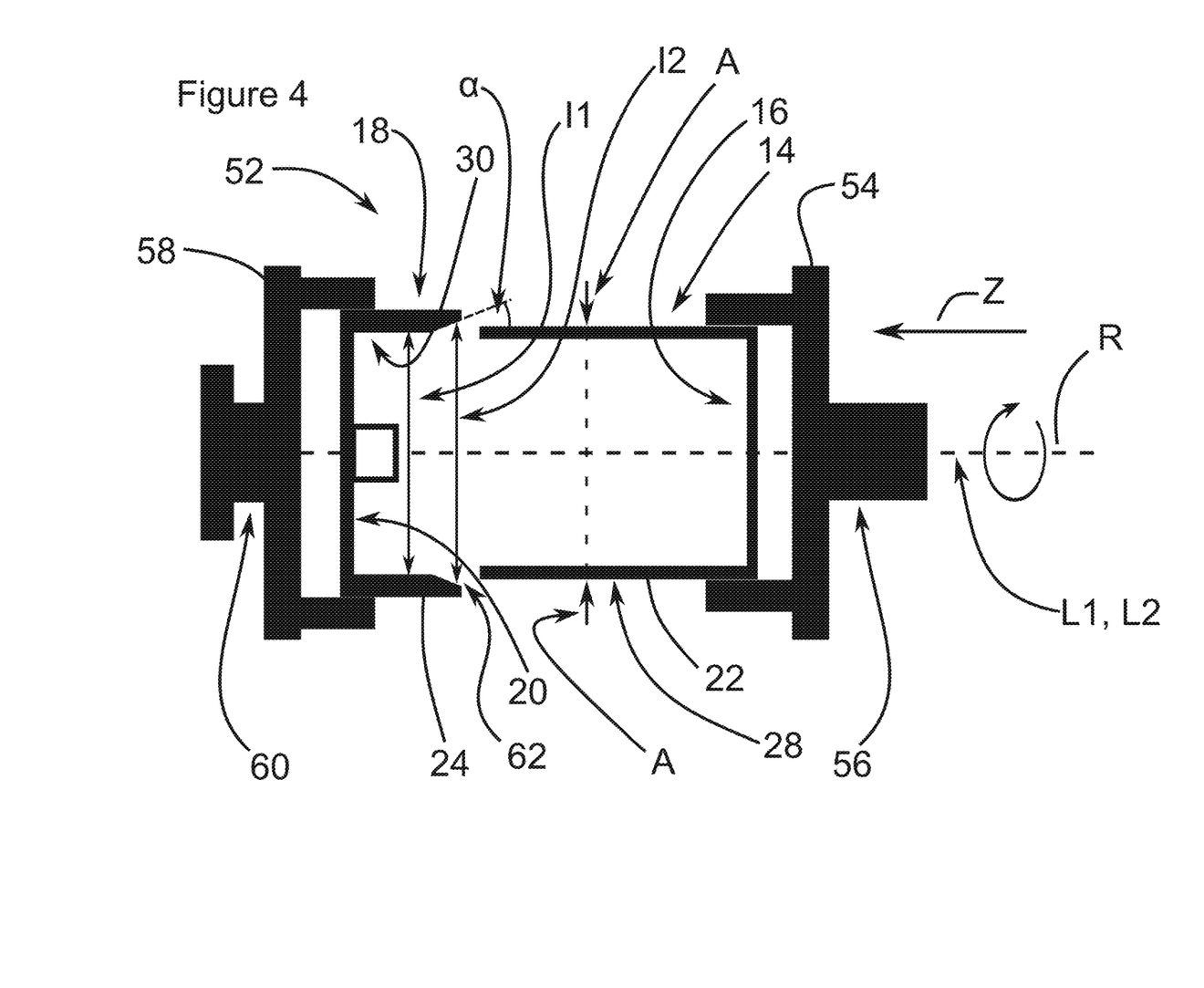
FIG. 4 is a depiction of a method of manufacturing a housing in accordance with the invention.

FIG. 4 illustrates the method of the invention with the use of a device 52 for the manufacture of a housing with a friction welding seam.

The device for the manufacture 52 shown by FIG. 4 comprises a first holder 54 into which a first part 14 of polycarbonate is clamped so as to be non-rotational relative to the first holder 54. A shaft 56 is arranged on the first holder 54, whereby said shaft can drive the holder by means of a rotational drive to rotate about an axis of rotation R. In addition, the first holder 54 can be moved along an infeed axis Z toward a second holder 58 of the device 52 or away therefrom in a translatory manner.

A second part 18 of polycarbonate having the shape of a cylindrical cap is clamped into the second holder 58 of the device. The second holder 58 comprises a swivel bearing 60 that can be locked against rotation. The second part 18 has a second wall 24 whose jacket-shaped inner wall surface 30 has initially the shape of a cylindrical casing and widens conically toward an end 62 of the second wall 24 remote from the end wall 20. Other than that, the second wall 24 has the shape of a cylindrical casing and is straight. The second inner wall surface 30 of the second wall 24 having the shape of a cylindrical casing has a first inside diameter I1 in the straight region of the second wall 24 having the shape of a cylindrical casing. In the conically tapering end 62, the second wall 24 has a second inside diameter I2, wherein the second inside diameter I2 is greater than the first inside diameter I1 in the straight region having the shape of a cylindrical casing due to the conically inclined wall surface at the end 62. Due to a second inside diameter I2 that is greater than the outside diameter A of the first part and a conically tapering form of the second part, it is possible to create a stop slope at an angle α. Preferably, the angle α is at most 3 degrees. For example, a lamp whose receptacle is indicated in FIG. 4 may be arranged in the second part 18.

The first part 14 and the second part 18 are preferably arranged so as to be concentric relative to each other. Between the longitudinal axes of the first part L1 and of the second part L2 that coincide with the axis of rotation R in the exemplary embodiment, there may also exist a parallel axis offset, or the longitudinal axes L1 and L2 may extend in non-parallel direction relative to each other. The first part 14 has a first wall 22 with an outer wall surface 28 having the shape of a cylindrical casing, said outer wall surface 28 having an outside diameter A. The outside diameter A is preferably greater than the first inside diameter I1, i.e., the first part represents an interference fit relative to the second part.

The method for the manufacture of the housing 10 may be performed, for example, with a device for the manufacture 52 as shown by FIG. 4 as described hereinafter:

The swivel bearing 60 is blocked against rotation, and the first part is rotated at a specific speed of rotation via the first holder 54, via the shaft 56 and via the driving motor. The first part 14 is moved along an infeed axis Z, said axis extending parallel to the axis of rotation R in the exemplary embodiment, back toward the second part 18 at a specific feed speed. The feed and rotation speeds can be kept constant or be varied during the friction welding process. Starting at a certain relative distance between the first part 14 and the second part 18, the first wall 22 and the second wall 24 come into contact with each other and frictional forces lead to a fusing of the material of the inner wall surface 30 and the outer wall surface 28. The feed movement is performed until the desired distance of the bottom 16 from the end wall 20 is reached. Then, the rotational movement of the first holder 54 is decelerated; in doing so, the blocking of the swivel bearing 60 counter the rotation can be eliminated, so that the second holder 58 also rotates, whereas the rotation overall comes to a stop.

From the foregoing, it can be seen that a housing 10 is provided which has a first part 14 with a first wall 22 having an outer wall surface 28 and a second part 18 with a second wall 24 having an inner wall surface 30. The wall surfaces can have, for example, a cylindrical casing shape at least in some sections. Portions of the first wall 22 and the second wall 24 overlap in an overlap region 26. The first wall 22 and the second wall 24 are connected along the circumference of the wall surfaces 28, 30 by means of a rotational friction welding seam 32 arranged in the overlap region 26. The rotational friction welding seam 32 has a compact zone 48 with a first elastic modulus and a mixing zone 44 with a different, second elastic modulus.

LIST OF REFERENCE SIGNS

10 Housing
12 Electrical operating means/lamp
14 First part
16 Bottom
18 Second part
20 End wall
22 First wall
24 Second wall
26 Overlap region
28 Outer wall surface
30 Inner wall surface
32 Rotational friction welding seam
34 Peripheral end surface
36 End surface of the end wall
38 Welding zone
40 First section
42 Second section
44 Mixing zone
46 Axial edge region
48 Compact zone
50 Recess/groove/pocket
52 Device for the manufacture
54 First holder
56 Shaft
58 Second holder
60 Swivel bearing
62 End
A Outside diameter
d Radial thickness
I1 First inside diameter
I2 Second inside diameter
L1 Longitudinal axis of the first part
L2 Longitudinal axis of the second part
R Axis of rotation
S Detail
Z Infeed axis
α Angle

The invention claimed is:

1. An explosion protected housing (10) for an electrical operating device (12) comprising:
 a first part (14) made of plastic having a first wall (22) with an outer wall surface (28) about an axis of said first part (14),
 a second part (18) made of plastic having a second wall (24) with an inner wall surface (30) about said axis,
 said first wall (22) and said second wall (24) have an overlap region (26), and
 said first part (14) and said second part (18) being connected to each other by a rotational friction welding seam (32) located in the overlap region (26) along circumferences of said wall surfaces (28, 30) of said first and second walls (22, 24) so as to form an explosion-proof enclosure for the electrical operating device satisfying the protection level of pressure-proof encapsulation (Ex-d) and/or the protection level of increased safety (Ex-e), said rotational friction welding seam (32) having at least one compact zone (48) formed of fully fused plastic material and one mixing zone (44) formed by partially fused plastic material that exhibits a higher resilience than the fully fused plastic material of said compact zone, and said mixing zone (44) being in an axial edge region (46) of the overlap region (26) where there is a transition from the overlap region (26) to a side wall surface of one of said parts.

2. The explosion protected housing (10) of claim 1 in which said rotational friction welding seam (32) has two of said mixing zones (44) that are separated by said compact zone (48) along said central axis (R) of the rotational friction welding seam (32).

3. The explosion protected housing (10) of claim 1 in which at least one of the first part (14) and the second part (18) has grooves (50) or pockets (50) in the wall surface (28, 30).

4. The explosion protected housing (10) of claim 3 in which said grooves (50) or pockets (50) of the first part (14) and/or of the second part (18) are arranged peripherally along the circumference of the wall surfaces (28, 30) in the overlap region (26).

5. The explosion protected housing (10) of claim 1 in which at least one of the first part (14) and the second part (18) is a cap or a stopper.

6. The explosion protected housing (10) of claim 1 in which at least one of the first wall (22) and the second wall (24) consists of amorphous plastic material.

7. The explosion protected housing (10) of claim 1 in which said first wall (22) and said second wall (24) consist of different materials.

8. The explosion protected housing (10) of claim 1 in which at least one of the first wall (22) and the second wall (24) consist of polycarbonate.

9. The explosion protected housing (10) of claim 1 in which at least one of the outer wall surface (28) of the first wall (22) and the inner wall surface (30) of the second wall (24) has a conical form within the overlap region (26).

10. The explosion protected housing (10) of claim 1 in which the first part (14) and the second part (18) are further welded to each other at one end surface (34, 36) of the first part and one end surface (34, 36) of the second part.

11. The explosion protected housing (10) of claim 1 in which the first part (14) and the second part (18) are connected to each other along their circumferences solely by a rotational friction welding seam (32) on the wall surfaces (28, 30) having a cylindrical casing shape.

12. The explosion protected housing (10) of claim 1 in which said mixing zone (44) of said rotational friction welding seam (32) has first elastic modulus, and said compact zone (48) of said rotational friction welding seam (32) has a second different elastic modulus greater than said first elastic modulus.

13. The explosion protected housing (10) of claim 1 in which the compact zone (48) of the rotational friction welding seam (32) has a more homogeneous material distribution than that of the mixing zone (44).

14. The explosion protected housing (10) of claim 1 in which said compact zone (48) of said rotational friction welding seam (32) has a greater material density than that of the mixing zone (44).

15. The explosion protected housing of claim 1 in which at least one of said parts has an end wall, and said compact zone is adjacent said end wall and said mixing zone is separated from said end wall by said compact zone.

16. A method for manufacturing the explosion protected housing of claim 1 comprising the steps of:

connecting the first wall (22) and the second wall (24) along their circumferential surfaces (28, 30) by rotational friction welding through rotation of one of said parts relative to the other of said parts to form rotational friction welding seam (32) having said compact zone (48) and said mixing zone (44).

17. The method of claim 16 in which said rotational friction welding forms a rotational friction welding seam (32) having said compact zone (48) with a greater elastic modulus than the elastic modulus of said mixing zone (44).

18. The method of claim 16 in which said rotational friction welding forms a welding seam (32) having a compact zone (48) with a greater material density than the mixing zone (44).

* * * * *